(12) United States Patent
Lintner

(10) Patent No.: US 6,575,668 B1
(45) Date of Patent: Jun. 10, 2003

(54) DEVICE FOR TRANSPORTING OBJECTS AND USE OF SAID DEVICE

(75) Inventor: Albert Lintner, Miesbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/807,375

(22) PCT Filed: Aug. 8, 2000

(86) PCT No.: PCT/DE00/02645

§ 371 (c)(1),
(2), (4) Date: Jul. 16, 2001

(87) PCT Pub. No.: WO01/13696

PCT Pub. Date: Feb. 22, 2001

(30) Foreign Application Priority Data

Aug. 12, 1999 (DE) .......................... 199 38 061

(51) Int. Cl.⁷ .............................. B65G 51/18
(52) U.S. Cl. ....................... 406/191; 138/156
(58) Field of Search ................. 406/191, 192, 406/193, 194; 138/156, 165, 104, 148, 113, 117

(56) References Cited

U.S. PATENT DOCUMENTS

| 2,176,439 A | * | 10/1939 | Taylor et al. ............... 406/191 |
| 3,537,485 A | * | 11/1970 | March ........................ 138/115 |
| 3,718,371 A | | 2/1973 | Lasch |
| 3,873,163 A | | 3/1975 | Gladish |
| 5,404,914 A | * | 4/1995 | Ziu ........................... 138/113 |

FOREIGN PATENT DOCUMENTS

| DE | 2241857 | 3/1973 |
| EP | 216 203 B1 | 4/1987 |
| EP | 216 203 | 4/1990 |
| EP | 452 038 A1 | 10/1991 |
| EP | 688 159 A1 | 12/1995 |

* cited by examiner

*Primary Examiner*—Joseph A. Dillon
(74) *Attorney, Agent, or Firm*—Staas & Halsey LLP

(57) ABSTRACT

The invention relates to a device for transporting objects by an airflow in a channel, which is produced by joining two interlocking bodies, the first body having a convex surface and the second body having a concave surface. The first body has a recess which forms the channel. The formation of this recess in a convex surface ensures that a high degree of dimensional accuracy and a good surface quality are easy to achieve.

7 Claims, 1 Drawing Sheet

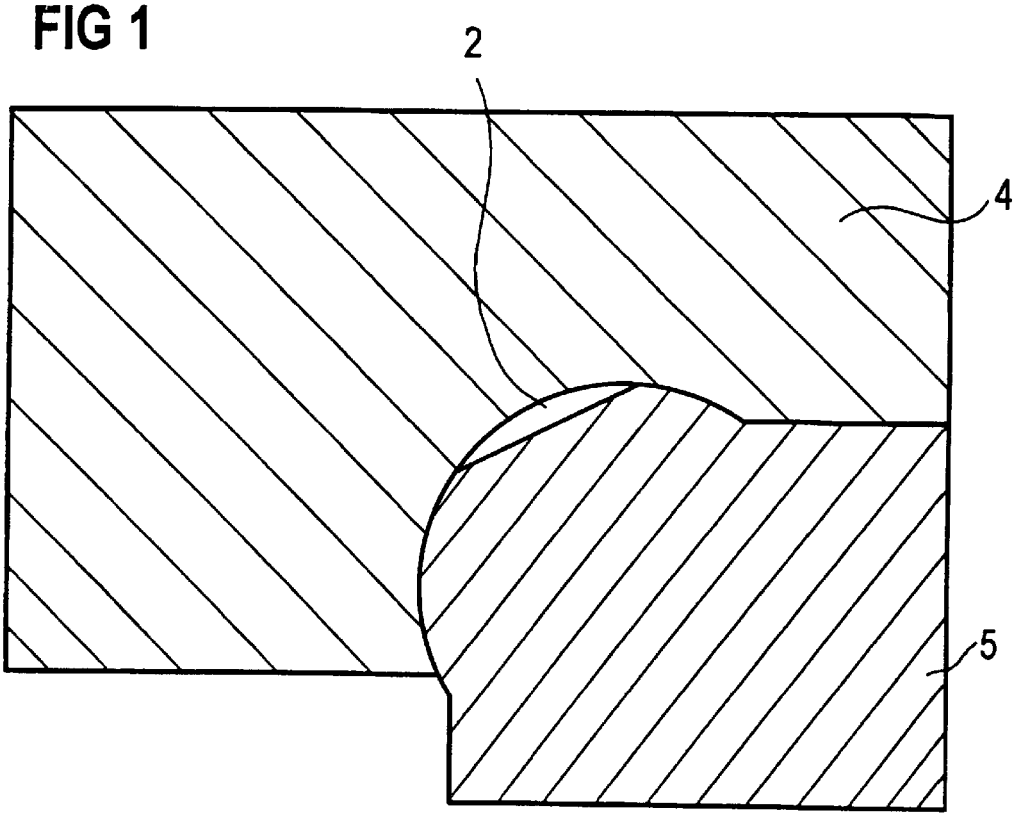
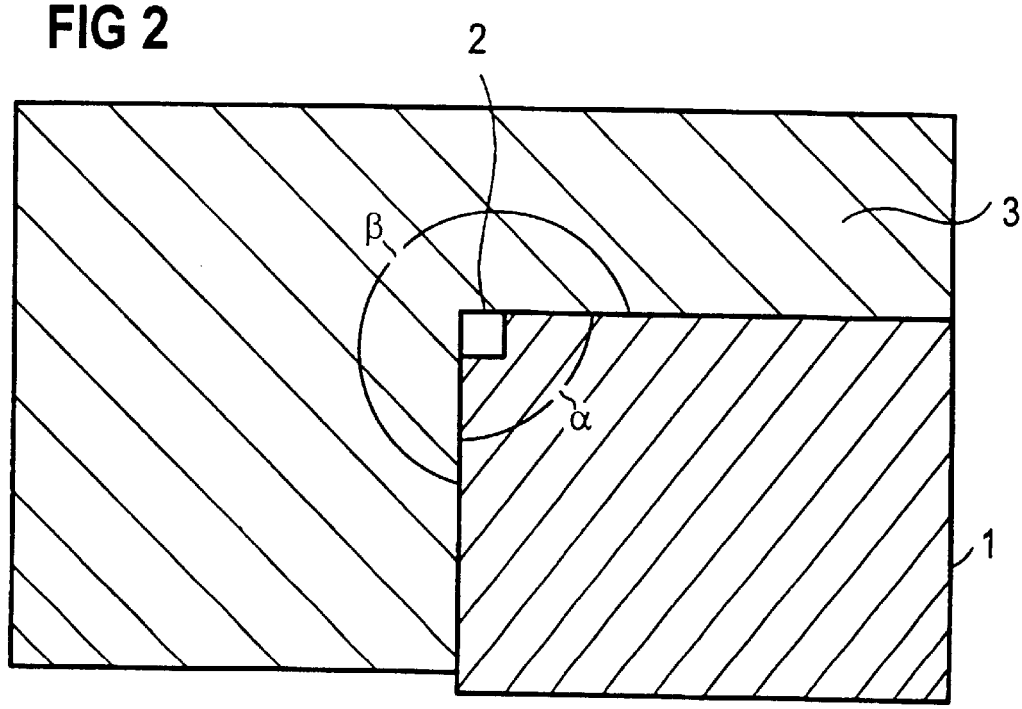

DEVICE FOR TRANSPORTING OBJECTS AND USE OF SAID DEVICE

BACKGROUND OF THE INVENTION

1. Field of the Invention

The invention relates to a device for transporting objects by means of airflow in a channel. The invention also relates to the use of the device.

2. Description of the Related Art

EP 0 216 203 B1 has disclosed a device for transporting objects by means of an airflow in a channel, in which the channel is formed by a cuboid body which has a substantially U-shaped recess extending over the length of the channel and covered by a plate.

The U-shape of the channel has the disadvantage that, in particular in the miniaturized dimension necessary for objects of less than 0.6 mm×0.6 mm, it cannot be produced with the necessary dimensional accuracy and smoothness of the surface. The consequence is that the objects are easily left behind in the channel.

SUMMARY OF THE INVENTION

It is therefore an object of the present invention to provide a device for transporting objects by means of an airflow in a channel in which the channel, adapted in diameter to objects of small dimensions, especially to objects of dimensions less than 0.6 mm×0.6 mm, can be produced with a very high degree of dimensional accuracy and smoothness of the walls.

This object is achieved, according to the invention, by a device for transporting objects by airflow in a channel, including a first body having a convex surface formed of a section of a cylinder and having a planar section recessed from and intersecting the convex surface and parallel to the longitudinal axis of the cylinder, and a second body joined interlockingly with the first body and having a concave surface matching the shape of the convex surface, so that the recess forms the channel. Alternatively, the device may include a first body having a surface formed of a right prism with a base polygon having adjacent sides forming an angle $\alpha<180°$ at an intersection of the adjacent sides, said first body having a recess along an edge of the prism at the intersection of the sides defining the angle $\alpha$, and a second body joined interlockingly with the first body and having a shape of a right prism with a base polygon having adjacent sides defining an angle $\beta$, such that $\alpha+\beta=360°$, so that the channel is formed with a uniform cross section defined by the adjacent sides of the second body and the recess extending along the edge of the first body.

BRIEF DESCRIPTION OF THE DRAWINGS

FIG. 1 shows a first device according to the invention in diagrammatic cross section.

FIG. 2 shows a second device according to the invention in diagrammatic cross section.

The invention is described in detail below with reference to two examples of embodiment and the associated figures.

DETAILED DESCRIPTION OF THE PREFERRED EMBODIMENTS

FIG. 1 shows a device according to the invention for transporting objects, in which the channel 2 is formed by joining a body 5, having a surface in the shape of a convex cylindrical surface, and a body 4, having a surface in the shape of a concave cylindrical surface. The body 5 contains a recess 2 which has a cross section in the shape of a segment of a circle, was formed by straight cutting-off of the cylindrical surface, and forms the channel 2.

FIG. 2 shows a device according to the invention for transporting objects in which the channel 2 is formed by joining a cuboid 1 and an L-shaped body 3. The cuboid 1 contains a recess of rectangular cross section which forms the channel 2.

The invention specifies a device for transporting objects by means of an airflow in a channel, which is shaped by joining a first body, having a convex surface, and a second body, having a concave surface. The shape of the concave surface matches the shape of the convex surface so that the two bodies can be interlockingly joined. The convex surface of the first body is described by a cylindrical surface. It has a linear recess enclosing at least parts of the convex surface and lying parallel to the longitudinal axis of the cylinder. This recess forms the channel together with the interlockingly attached second body.

As a result of the formation of the channel according to the invention from a convex and a concave body, a substantial part of the channel is already preformed by the shape of the bodies. The channel can thus be produced, for example, by a simple straight cutting-off of part of the convex surface of the first body. In contrast to the formation of a U-shaped channel such a processing step can be carried out with much greater accuracy.

Furthermore, the invention specifies a device for transporting objects by means of an airflow in a channel in which the channel is formed by joining two bodies which are so delimited by plane surfaces that they can be joined interlockingly. The first body has the shape of an imaginary right prism, in which, in the polygon delimiting its base surface, two sides define an angle $\alpha<180°$. The second body likewise has the shape of a right prism, in which, in the polygon delimiting its base surface, at least two sides define a reflex angle $\beta$, such that $\alpha+\beta=360°$. The first body (1) has a recess enclosing at least an edge of the prism lying between the sides defining the angle $\alpha$, so that the channel extending parallel to this edge is formed with a uniform cross section between the first and the added second body and encloses the recess.

As a result of the formation according to the invention of the channel by means of two bodies delimited by plane surfaces and interlockingly fitting together, a substantial part of the channel is already preformed by the shape of the bodies. The channel can thus be produced, for example, by a simple straight cutting-out of a recess of L-shaped cross section from the first body. In contrast to the formation of a U-shaped channel, such a processing step can be carried out with much greater accuracy.

Many objects to be transported have the cross-sectional shape of parallelograms, in particular rectangles. It is therefore particularly advantageous to design the cross section of the channel as a parallelogram.

Moreover, a device for transporting objects in which the recess is a square in cross section having a surface area less than 0.6 mm×0.6 mm and in which the angle $\alpha=90°$ is particularly advantageous. Such a device is, first, particularly suitable for transporting small objects having dimensions corresponding to the cross section of the recess. In addition, the channel of this device is particularly easy to produce from an L-shaped body and a cuboid body, one side edge of which is replaced by an L-shaped recess.

In the device according to the invention, the recess forming the channel can be produced in a particularly simple manner with dimensional accuracy and with smooth walls. It is particularly suitable for transporting objects by means of an airflow over relatively long distances. Accordingly, a device for transporting objects in which the length of the recess and hence of the channel is greater than 400 mm is particularly advantageous.

The device according to the invention for transporting objects can be used particularly advantageously for transporting electrical components, in particular resistors or capacitors. Accordingly, the device can be used in a particularly advantageous manner in feed modules for automatic fitting machines for fitting circuit boards with electrical components.

What is claimed is:

1. A device for transporting objects by an airflow in a channel, comprising
    a first body having a surface formed of a right prism with a base polygon having adjacent sides forming an angle $\alpha<180°$ at an intersection of the adjacent sides, said first body having a recess along an edge of the prism at the intersection of the sides defining the angle $\alpha$, and
    a second body joined interlockingly with the first body and having a shape of a right prism with a base polygon having adjacent sides defining an angle $\beta$, such that $\alpha+\beta=360°$, so that the channel is formed with a uniform cross section defined by the adjacent sides of the second body and the recess extending along the edge of the first body.

2. The device as claimed in claim 1, in which the channel, is a parallelogram in cross section.

3. The device as claimed in claim 1, in which the angle $\alpha=90°$ and the channel is a square in cross section having a surface area less than 0.6 mm×0.6 mm.

4. The device as claimed in claim 1, further comprising an entry at one end of the channel to receive objects which include electrical components for transport through the channel.

5. The device as claimed in claim 1, further comprising an entry at one end of the channel to receive at least one of resistors and capacitors for transport through the channel.

6. The device as claimed in claim 1, further comprising an entry at one end of the channel to receive modules for automatic fitting machines for transport through the channel.

7. The device as claimed in claim 3, in which the length of the channel is greater than 400 mm.

\* \* \* \* \*